(12) United States Patent
Lee

(10) Patent No.: US 6,214,677 B1
(45) Date of Patent: Apr. 10, 2001

(54) METHOD OF FABRICATING SELF-ALIGNED ULTRA SHORT CHANNEL

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/426,923

(22) Filed: Oct. 22, 1999

(51) Int. Cl.[7] .................................................. H01L 21/336
(52) U.S. Cl. .......................... 438/284; 438/253; 438/304; 438/307; 438/596
(58) Field of Search .............................. 257/344; 438/284, 438/253, 304, 307, 596, FOR 189, FOR 199, FOR 188

(56) References Cited

U.S. PATENT DOCUMENTS

| 4,954,854 | * | 9/1990 | Dhong et al. . |
| 5,538,913 | * | 7/1996 | Hong . |
| 5,723,352 | * | 3/1998 | Shih et al. . |
| 5,780,339 | * | 7/1998 | Liu et al. . |
| 5,926,707 | * | 7/1999 | Seo . |
| 5,960,270 | * | 9/1999 | Misra et al. . |

FOREIGN PATENT DOCUMENTS 61-234567 * 10/1986 (JP) .

* cited by examiner

Primary Examiner—George Fourson
Assistant Examiner—Michelle Estrada
(74) Attorney, Agent, or Firm—Thomas, Kayden, Horstemeyer & Risley

(57) ABSTRACT

A method for fabricating a self-aligned ultra short channel. The method uses double spacers as a hard mask, so that DRAM with the ultra short channel is formed in a self-aligned process. This method not only reduces the channel length, but also adjusts the dopants in lightly doped drains (LDD) at a side of the storage node opening and at the side of the bit line, respectively, so as to optimize the device property.

20 Claims, 3 Drawing Sheets

METHOD OF FABRICATING SELF-ALIGNED ULTRA SHORT CHANNEL

BACKGROUND OF THE INVENTION

1. Field of Invention

The present invention relates to a fabrication method for a dynamic random access memory (DRAM). More particularly, the present invention relates to a method of fabricating a self-aligned ultra short channel.

2. Description of Related Art

As the size of the semiconductor device has gradually been reduced according to the design rule, a photolithographic process usually adopted in the semiconductor process reaches a bottleneck in terms of controlling the critical dimension, since the process is limited by light resolution and depth of focus. Such problem has a serious impact on area reduction of a memory cell.

Conventionally, a more complicated mask, such as a phase shift mask (PSM) and special exposure technology, such as off-axis illumination (OAI) are used to pattern a photoresist, so that the light resolution is improved. Although the critical dimension has been reduced as a consequence of the combination described above, the production cost of the integrated circuit has been greatly increased.

With advanced technology, the channel length of the MOS device is reduced during semiconductor process to significantly improve the operation speed of a transistor. However, problems such as short channel effects and associated hot electron effects occur when channel length is reduced to a certain extent, and consequently lead to an electrical breakdown. One solution to improve the short channel effects involves forming a doped region that has a lower doped concentration than that of a source/drain region, with the doped region known as a lightly doped drain (LDD) region.

In addition, the size of the memory cell and an area occupied by the DRAM capacitor have also been reduced, respectively, with respect to an increase in DRAM integration. Such size reduction for the memory cell can cause a decrease in a capacitance. In order to maintain the capacitance in an acceptable range, the high integration DRAM adopts a three-dimensional capacitor structure, such as a stacked capacitor, a trench stacked capacitor, and a crown shape capacitor to provide a large capacitor area. However, the increased complexity of the capacitor structure has caused an increase in the height of the capacitor and an increased capacitance in turns. Thus, a storage node consisting of a capacitor-over-bit line (COB) layout is developed, wherein the layout is not limited in terms of space for the capacitor.

SUMMARY OF THE INVENTION

The invention provides a method for fabricating a self-aligned ultra short channel with double spacers, which serve as a hard mask to form a DRAM having an ultra short channel in a self-aligned process. In the invention, the channel length is reduced, while the doping in the node opening side of the lightly doped region and the bit line side of the lightly doped region can be adjusted to optimize the device property.

As embodied and broadly described herein, the invention provides a fabrication method for a self-aligned ultra short channel. The method first provides a substrate with isolation structures formed therein. A pad oxide layer and a mask layer are then formed in sequence on the substrate, and patterned to form an opening which exposes the substrate. An ion implantation step is performed to form a first lightly doped region in the substrate, while a first spacer is formed on the sidewall of the opening. With the first spacer serving as a hard mask, another ion implantation step is performed, so that a first heavily doped region is formed in the substrate. The first lightly doped region and the first heavily doped region constitute a source region, while a first lightly doped drain (LDD) region is formed at a location where the first lightly doped region does not overlap with the first heavily doped region. A conducting layer that covers the mask layer and fills the opening is formed, followed by planarizing the conducting layer for forming a bit line, while the mask layer and the pad oxide layer are subsequently removed to expose the substrate. A gate oxide layer is formed on the exposed substrate, while a second spacer is formed to cover a sidewall of the first spacer and a part of the gate oxide layer. With the second spacer serving as a hard mask, an ion implantation step is performed to form a second lightly doped region. An oxide layer is formed to cover the gate oxide layer before planarizing the oxide layer, the first spacer, the second spacer, and the conducting layer. A patterned dielectric layer is formed to cover the planarized oxide layer, the first spacer, the second spacer, and the conducting layer with formation of a contact opening which exposes the conducting layer before filling the contact opening with a patterned conducting layer. Furthermore, an inter polysilicon dielectric (IPD) layer is formed on the dielectric layer, followed by patterning the IPD layer, the dielectric layer, the oxide layer, and the gate oxide layer, whereby a storage node opening which exposes the second lightly doped region is formed. Another ion implantation step is performed to form a second heavily doped region in the substrate. The second lightly doped region and the second heavily doped region constitute a drain region, and a second LDD region is formed at a location where the second lightly doped region does not overlap with the second heavily doped region. A conducting layer which covers the inter polysilicon dielectric layer and fills the storage node opening is formed and patterned to complete formation of a storage electrode of a capacitor.

Accordingly, the second spacer is made of tungsten, whose fabrication technology is mature, so it is possible to fabricate tungsten spacer with a thickness smaller than about 0.1 $\mu$m. Therefore, in the invention, the MOS DRAM device having an ultra short channel can be fabricated with the tungsten spacer serving as a hard mask, and a lower photolithographic requirement, both of which result in a reduction of the channel length. Hence, this increases the operation speed of the device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A to 1G are schematic, cross-sectional diagrams illustrating steps for fabricating a DRAM having a self-aligned ultra short channel according to one preferred embodiment of this invention.

Figure 1A:
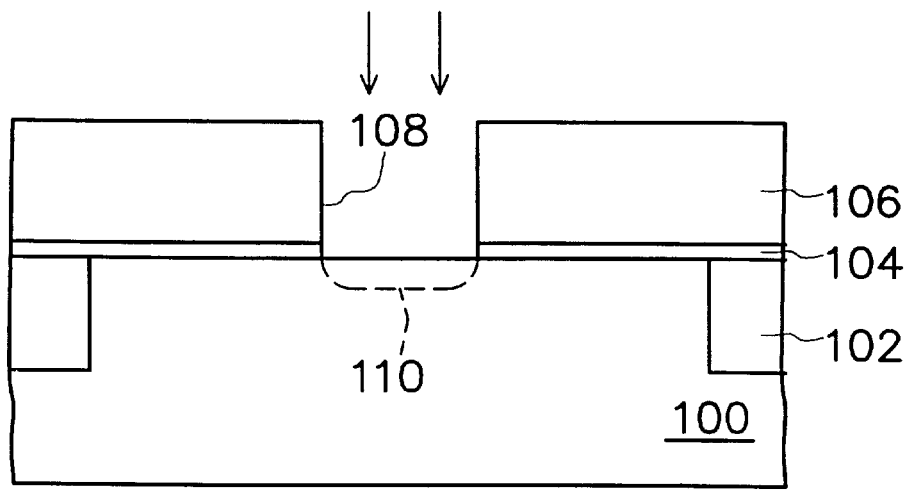
FIGS. 1A to 1G are schematic, cross-sectional diagrams illustrating steps for fabricating a DRAM having a self-aligned ultra short channel according to one preferred embodiment of this invention.

Referring to FIG. 1A, a semiconductor substrate 100 is provided with isolation structures 102 formed therein. This defines an active area of a device in the substrate. The method for forming the isolation structure involves local oxidation (LOCOS) and shallow trench isolation (STI). A pad oxide layer 104 and a mask layer 106 are formed in sequence on the substrate 100, wherein the mask layer 106 includes silicon nitride. An opening 108 is formed in the pad oxide layer 104 and the mask layer 106 to expose the substrate 100, wherein the opening 108 may subsequently serve for forming a bit line.

As formation of a lightly doped drain (LDD) region has been known to effectively improve the short channel effect, an ion implantation step is performed to form a first lightly doped region 110 in the substrate 100. A drive-in process is further performed to allow ions from the first lightly doped region 110 to diffuse slightly to below the pad oxide layer 104. According to the present invention, the doped ions are n-type ions when the substrate 100 is made of p-type silicon.

Figure 1B:
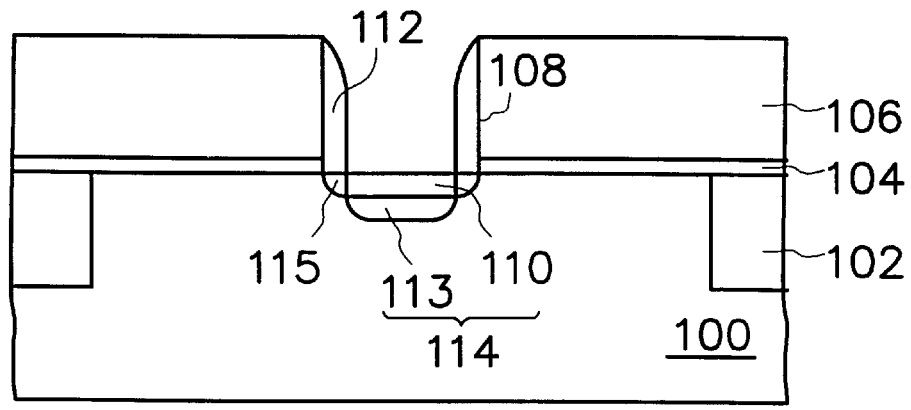

Referring to FIG. 1B, a first spacer 112 is formed on a sidewall of the opening 108, wherein the first spacer 112 includes silicon oxide. With the first spacer 112 serving as a hard mask, an ion implantation step is performed to form a first heavily doped region 113 in the substrate 100. The ions in this case have a higher doped concentration than that of the first lightly doped region 110. The first lightly doped region 110 and the first heavily doped region 113 constitute a source region 114, while a first LDD region 115 is formed in a portion of the first lightly doped region 110 which does not overlap with the first heavily doped region 113.

Figure 1C:
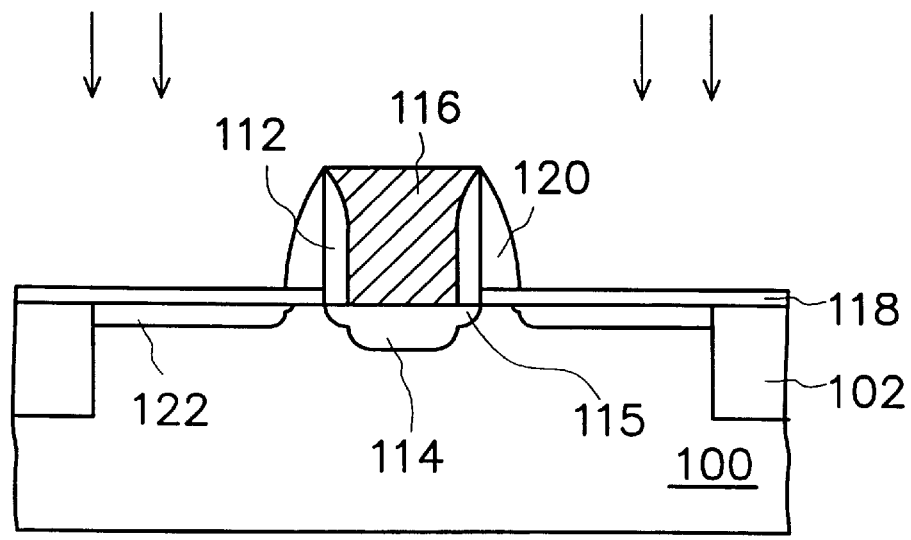

Referring to FIG. 1C, a conductive layer (not shown) which covers the mask layer 106 and fills the opening 108 is formed and then planarized to form a conductive layer 116 which couples to the source region 114, wherein the conductive layer 116 includes polysilicon. The pad oxide layer 104 and the mask layer 106 are removed in sequence to expose the substrate 100, while a gate oxide layer 118 is formed on the exposed substrate 100. A second spacer 120 is formed to cover a sidewall of the first spacer 112 and a part of the gate oxide layer 118, wherein the second spacer 120 includes tungsten. The method for forming the second spacer 120 involves globally covering with a tungsten layer, followed by performing an anisotropic etching step to form the second spacer 120.

With the second spacer 120 serving as a hard mask, an ion implantation step is performed to form a second lightly doped region 122. A drive-in process is further performed to allow ions from the second lightly doped region 122 to diffuse slightly to below the second spacer 120.

Figure 1D:
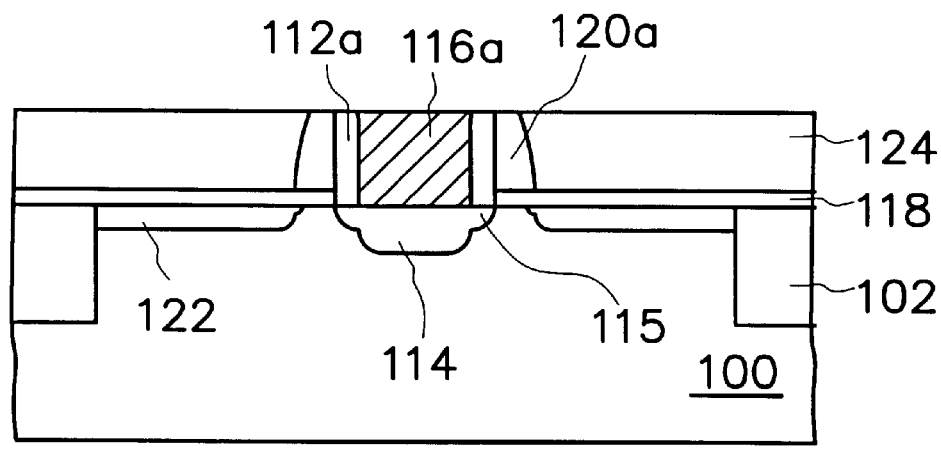

Referring to FIG. 1D, an oxide layer (not shown) is formed to cover the gate oxide layer 118, the second spacer 120, and the conductive layer 116. The oxide layer, the second spacer 120, the first spacer 112, and the conductive layer 116 are planarized to form a planarized oxide layer 124, the second spacer 120a, the first spacer 112a, and the conducting layer 116a. The second spacer 120a in this case serves as a word line, while the conducting layer 116a serves as a bit line.

Figure 1E:
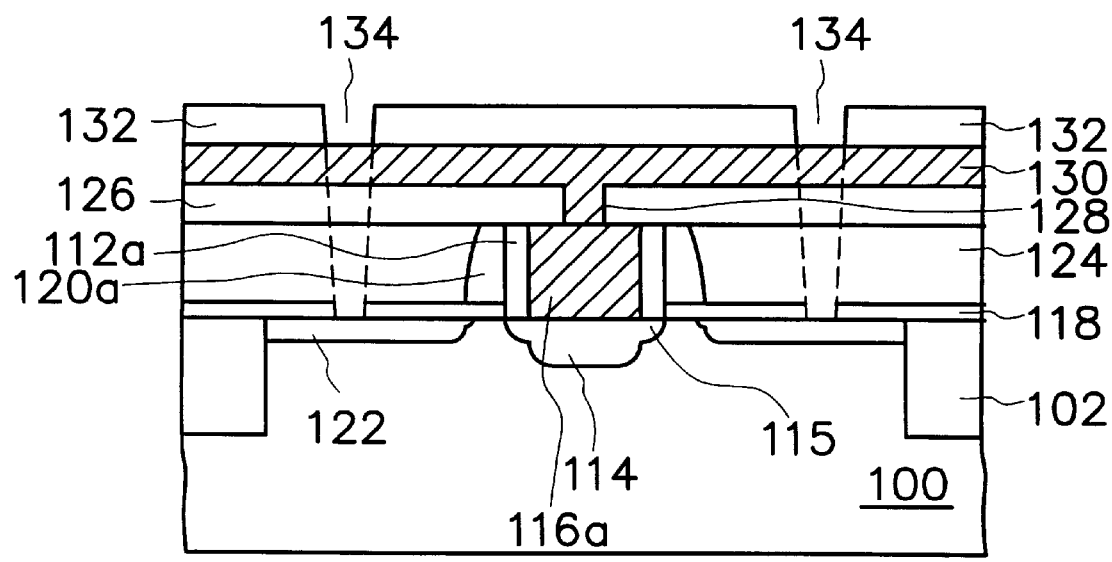

Referring to FIG. 1E, a planarized dielectric layer 126 is formed to cover the oxide layer 124, the second spacer 120a, the first spacer 112a, and the conducting layer 116a. The dielectric layer 126 may comprise multiple oxide layers or be made from materials such as silicon oxide and borophosphosilicate glass (BPSG). The method for forming the dielectric layer 126 involves depositing the dielectric layer 126 by a process, such as chemical vapor deposition (CVD), followed by planarizing the dielectric layer 126. A contact opening 128 which exposes the conducting layer 116a is formed in the dielectric layer 126. A conducting layer (not shown) which covers the dielectric layer 126 and fills the contact opening 128 is formed and planarized. The conducting layer is patterned to form a conducting layer 130 which couples to the bit line 116a, wherein the conducting layer 130 includes polysilicon.

An inter-polysilicon dielectric (IPD) layer is formed on the conducting layer 130, wherein the method for forming the IPD layer involves CVD. A storage node opening 134 which exposes the second lightly doped region 122 is formed in the oxide layer 124 and the gate oxide layer 118.

Figure 1F:
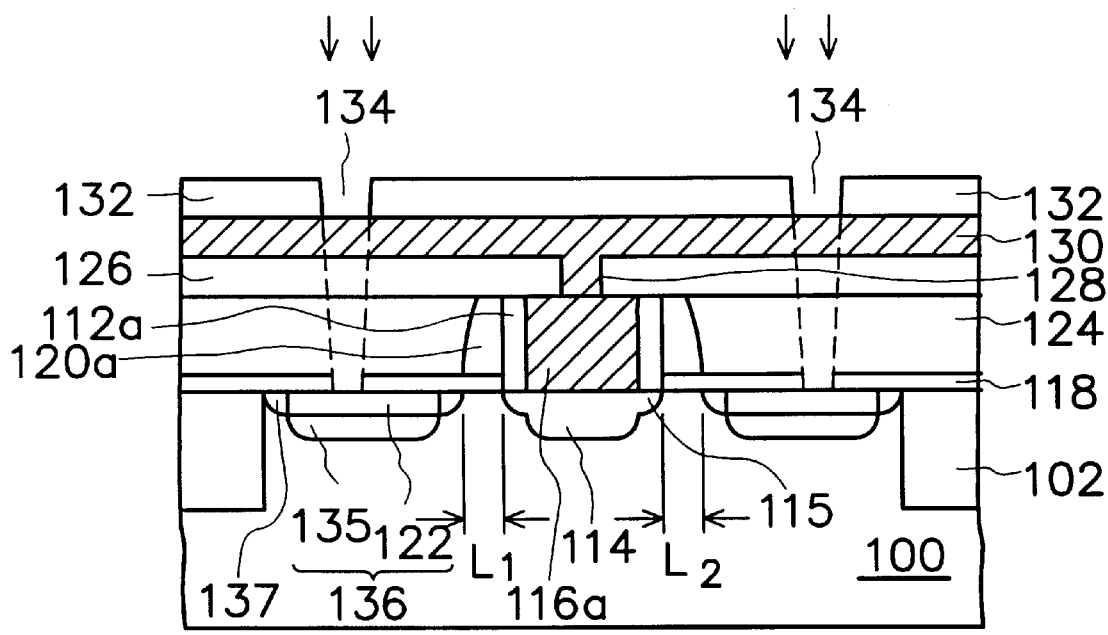

Referring to FIG. 1F, an ion implantation step is performed to form a second heavily doped region 135 in the substrate 100, wherein the ions involved in this implantation step have a higher doped concentration than those of the second lightly doped region 122. The second lightly doped region 122 and the heavily doped region 135 constitute a drain region 136, while a second LDD region 137 is formed in a portion of the second lightly doped region 122 which does not overlap with the heavily doped region 135. The second LDD region 137 is spaced apart from the adjacent first LDD region 115 by channel lengths $L_1$ and $L_2$, respectively. The channel lengths $L_1$ and $L_2$ are formed by self-alignment so that the channel length $L_1$ is approximately equal to the channel length $L_2$.

As the second spacer 120 is made of tungsten, whose fabrication technology is mature, the tungsten spacer having a thickness of below 0.1 μm is provided. According to the present invention, the channel lengths $L_1$ and $L_2$ are reduced by using the tungsten spacer as the hard mask accompanied with the drive-in process, as well as a lower photolithographic requirement. As a result, a MOS DRAM device with the ultra short channel is made to increase an operation rate of the device.

Figure 1G:
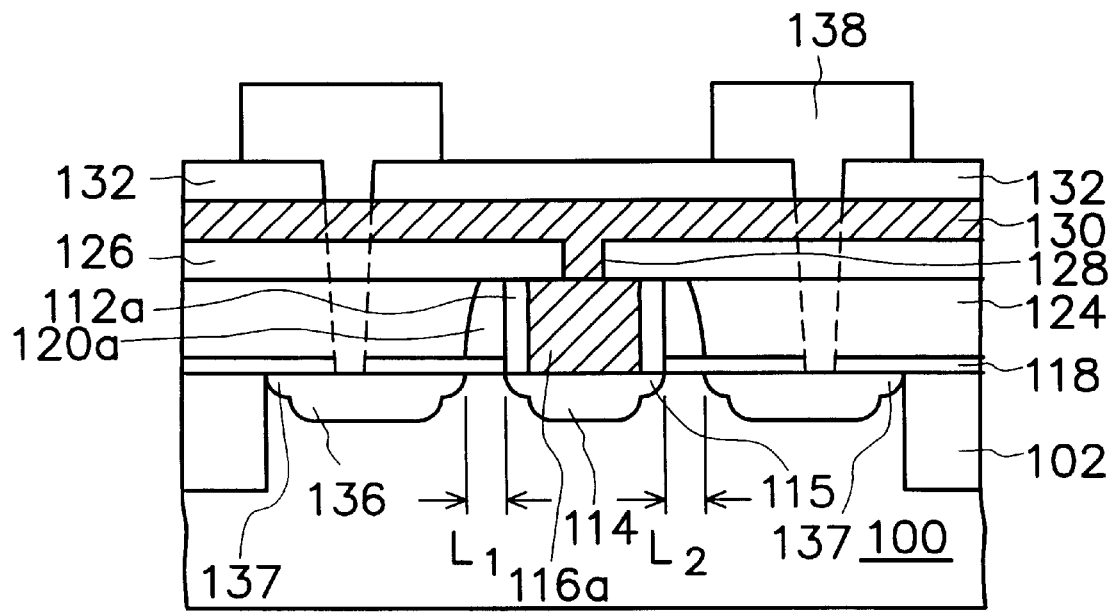

Referring to FIG. 1G, a conducting layer (not shown) which covers the IPD layer 132 and fills the storage node opening is formed to couple with the drain region 136, wherein the deposited thickness of the conducting layer is approximately equal to the height of a subsequently formed storage electrode. The conducting layer is patterned to form a storage electrode 138 of the capacitor, wherein the storage electrode 138 includes polysilicon.

The double spacers disclosed in the invention serve as the hard mask in the self-aligned formation of the DRAM with the ultra short channel. Thus, the disclosed method not only reduces the channel length, but also adjust the dopants in the LDD regions at the side of the storage node opening and at the side of the bit line, respectively, so as to optimize the device property.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for forming a DRAM, the method comprising steps of:

providing a substrate with an isolation structure formed therein;

forming a pad oxide layer having an opening and a mask layer in sequence on the substrate, wherein the opening exposes the substrate;

forming a first lightly doped region in the substrate;

forming a first spacer on a sidewall of the opening;

performing an ion implantation step, with the first spacer serving as a hard mask, so that a first heavily doped region is formed in the substrate, wherein the first lightly doped region and the first heavily doped region constitute a source region, and a lightly doped source region is formed in a portion of the first lightly doped region, which portion does not overlap with the first heavily doped region;

forming a bit line which fills the opening, wherein the bit line is coupled to the source region;

removing the mask layer and the pad oxide layer in sequence;

forming a gate oxide layer on the resulting exposed substrate;

forming a second spacer to cover a sidewall of the first spacer and a part of the gate oxide layer;

performing an ion implantation step, with the second spacer serving as a hard mask, so that a second lightly doped region is formed in the substrate;

forming an oxide layer on the substrate;

planarizing the oxide layer, the second spacer, the bit line, and the first spacer;

forming a dielectric layer having a contact opening on the substrate, wherein the contact opening exposes the bit line;

forming a patterned conducting layer which fills the contact opening on the dielectric layer, wherein the conducting layer couples with the bit line;

forming an inter-polysilicon dielectric layer on the substrate;

forming a storage node opening in the inter-polysilicon dielectric layer, the dielectric layer, the oxide layer, and the gate oxide layer, wherein the storage node opening exposes the second lightly doped region;

performing an ion implantation step, so that a second heavily doped region is formed in the substrate, wherein the second lightly doped region and the second heavily doped region constitute a drain region, and a second lightly doped drain region is formed in a portion of the second lightly doped region which does not overlap with the second heavily doped region; and forming a patterned storage electrode which fills the storage node opening on the inter-polysilicon dielectric layer, wherein the storage electrode couples with the drain region.

2. The fabrication method of claim 1, wherein the mask layer includes a silicon nitride layer.

3. The fabrication method of claim 1, wherein the first spacer includes a silicon oxide layer.

4. The fabrication method of claim 1, wherein the bit line includes a polysilicon layer.

5. The fabrication method of claim 1, wherein the second spacer includes a tungsten layer.

6. The fabrication method of claim 1, wherein the conducting layer includes a polysilicon layer.

7. The fabrication method of claim 1, wherein the storage electrode includes a polysilicon layer.

8. The fabrication method of claim 1, wherein the second lightly doped drain region is spaced apart from the adjacent first lightly doped source region by channel lengths $L_1$ and $L_2$, respectively.

9. The fabrication method of claim 8, wherein the channel length $L_1$ is approximately equal to the channel length $L_2$.

10. A fabrication method for a self-aligned ultra short channel field effect transistor, the method comprising steps of:

providing a substrate with an isolation structure formed therein;

forming a pad oxide layer having an opening and a mask layer in sequence on the substrate, wherein the opening exposes the substrate;

forming a first lightly doped region in the substrate;

forming a first spacer on a sidewall of the opening;

performing an ion implantation step, with the first spacer serving as a hard mask, so that a first heavily doped region is formed in the substrate, wherein the first lightly doped region and the first heavily doped region constitute a source region, and a lightly doped source region is formed in a portion of the first lightly doped region, which portion does not overlap with the first heavily doped region;

forming a bit line which fills the opening, wherein the bit line is coupled to the source region;

removing the mask layer and the pad oxide layer in sequence;

forming a gate oxide layer on the resulting exposed substrate;

forming a second spacer to cover a sidewall of the first spacer and a part of the gate oxide layer; and performing an ion implantation step, with the second spacer serving as a hard mask, so that a second lightly doped region is formed in the substrate.

11. The fabrication method of claim 10, wherein the mask layer includes a silicon nitride layer.

12. The fabrication method of claim 10, wherein the first spacer includes a silicon oxide layer.

13. The fabrication method of claim 10, wherein the bit line includes a polysilicon layer.

14. The fabrication method of claim 10, wherein the second spacer includes a tungsten layer.

15. The fabrication method of claim 10, wherein the second lightly doped drain region is spaced apart from the adjacent first lightly doped source region by channel lengths $L_1$ and $L_2$, respectively.

16. The fabrication method of claim 15, wherein the channel length $L_1$ is approximately equal to the channel length $L_2$.

17. A fabrication method for DRAM having an ultra short channel, applicable to a substrate on which is formed a pad oxide layer with an opening for exposing the substrate and a silicon nitride layer in sequence, the method comprising steps of:

providing a substrate with an isolation structure formed therein;

forming the pad oxide layer having an opening and the silicon nitride layer in sequence on the substrate, wherein the opening exposes the substrate;

forming a first lightly doped region in the substrate;

forming a first spacer on a sidewall of the opening;

performing an ion implantation step, with the first spacer serving as a hard mask, so that a first heavily doped region is formed in the substrate, wherein the first lightly doped region and the first heavily doped region constitute a source region, and a lightly doped source region is formed in a portion of the first lightly doped region, which portion does not overlap with the first heavily doped region;

forming a bit line which fills the opening, wherein the bit line is coupled to the source region;

removing the mask layer and the pad oxide layer in sequence;

forming a gate oxide layer on the resulting exposed substrate;

forming a second spacer to cover a sidewall of the first spacer and a part of the gate oxide layer;

performing an ion implantation step, with the second spacer serving as a hard mask, so that a second lightly doped region is formed in the substrate;

forming an oxide layer on the substrate;

planarizing the oxide layer, the second spacer, the bit line, and the first spacer;

forming a dielectric layer having a contact opening on the substrate, wherein the contact opening exposes the bit line;

forming a patterned conducting layer which fills the contact opening on the dielectric layer, wherein the conducting layer couples with the bit line;

forming an inter-polysilicon dielectric layer on the substrate;

forming a storage node opening in the inter-polysilicon dielectric layer, the dielectric layer, the oxide layer, and the gate oxide layer, wherein the storage node opening exposes the second lightly doped region;

performing an ion implantation step, so that a second heavily doped region is formed in the substrate, wherein the second lightly doped region and the second heavily doped region constitute a drain region, and a second lightly doped drain region is formed in a portion of the second lightly doped region, which portion does not overlap with the second heavily doped region; and forming a patterned storage electrode which fills the storage node opening on the inter-polysilicon dielectric layer, wherein the storage electrode couples with the drain region.

18. The fabrication method of claim 17, wherein the first spacer includes a silicon oxide layer.

19. The fabrication method of claim 17, wherein the second spacer includes a tungsten layer.

20. The fabrication method of claim 17, wherein the second lightly doped drain region is spaced apart from the adjacent first lightly doped source region by channel lengths $L_1$ and $L_2$, respectively, wherein the channel length $L_1$ is approximately equal to the channel length $L_2$.

* * * * *